(12) United States Patent
Wang

(10) Patent No.: US 10,930,190 B2
(45) Date of Patent: Feb. 23, 2021

(54) DISPLAY PANEL, METHOD FOR COMPENSATING FOR THE SAME, AND DISPLAY DEVICE

(71) Applicant: BOE Technology Group Co., Ltd., Beijing (CN)

(72) Inventor: Wenbo Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/419,733

(22) Filed: May 22, 2019

(65) Prior Publication Data

US 2020/0051478 A1 Feb. 13, 2020

(30) Foreign Application Priority Data

Aug. 7, 2018 (CN) .......................... 201810892077.2

(51) Int. Cl.
*G09G 3/20* (2006.01)
*H03K 5/24* (2006.01)

(52) U.S. Cl.
CPC ................. *G09G 3/20* (2013.01); *H03K 5/24* (2013.01); *G09G 2300/04* (2013.01); *G09G 2320/0233* (2013.01); *G09G 2320/0673* (2013.01)

(58) Field of Classification Search
CPC ............. G09G 3/20; G09G 2320/0233; G09G 2300/04; G09G 2320/0673; H03K 5/24
See application file for complete search history.

(56) References Cited

U.S. PATENT DOCUMENTS

| 6,995,758 | B2 * | 2/2006 | Fukuda ................ | G09G 3/3685 |
| | | | | 345/100 |
| 7,358,968 | B2 * | 4/2008 | Sasada ................... | G09G 3/294 |
| | | | | 257/197 |
| 7,969,429 | B2 * | 6/2011 | Sasada ................... | G09G 3/296 |
| | | | | 345/204 |
| 8,593,389 | B2 * | 11/2013 | Yen ...................... | G09G 3/3696 |
| | | | | 345/100 |
| 9,240,160 | B2 * | 1/2016 | Wang ................... | G09G 3/3696 |
| 9,378,707 | B2 * | 6/2016 | Lee ....................... | G09G 3/3208 |
| 9,601,043 | B2 * | 3/2017 | Hikichi ............... | G09G 3/3688 |
| 9,870,747 | B2 * | 1/2018 | Park ..................... | G09G 3/3666 |
| 10,074,336 | B2 * | 9/2018 | Takata ................. | G09G 3/3696 |

(Continued)

*Primary Examiner* — Michael J Jansen, II
(74) *Attorney, Agent, or Firm* — Arent Fox LLP; Michael Fainberg

(57) ABSTRACT

The disclosure discloses a display panel, a method for compensating for the same, and a display device. The display panel includes a primary driver chip and at least one slave driver chip, each of which includes a gamma circuit; a processing circuit; and signal collectors on respective driver chips, configured to acquire current voltage at corresponding binding points of respective gamma circuits. The processing circuit is configured to compare current voltage at corresponding binding points of respective gamma circuits on respective slave driver chips with current voltage at a corresponding binding point of a gamma circuit on the primary driver chip, and to compensate for voltage to be output at the corresponding binding points of the respective gamma circuits on the respective slave driver chips according to comparison results so that current voltage at the corresponding binding points of the respective gamma circuits on the respective driver chips are same.

14 Claims, 4 Drawing Sheets

(56) References Cited

U.S. PATENT DOCUMENTS

| | | | |
|---|---|---|---|
| 10,186,229 B2* | 1/2019 | Seki | G09G 3/3688 |
| 10,460,694 B2* | 10/2019 | Seki | G09G 3/3696 |
| 2002/0030647 A1* | 3/2002 | Hack | G09G 3/3283 |
| | | | 345/82 |
| 2002/0044142 A1* | 4/2002 | Fukuda | G09G 3/3696 |
| | | | 345/204 |
| 2005/0134533 A1* | 6/2005 | Sasada | G09G 3/296 |
| | | | 345/60 |
| 2008/0068368 A1* | 3/2008 | Sasada | G09G 3/296 |
| | | | 345/211 |
| 2012/0194575 A1* | 8/2012 | Yen | G09G 3/3688 |
| | | | 345/690 |
| 2014/0184657 A1* | 7/2014 | Lee | G09G 3/3208 |
| | | | 345/690 |
| 2014/0232755 A1* | 8/2014 | Wang | G09G 3/3696 |
| | | | 345/690 |
| 2015/0109348 A1* | 4/2015 | Hikichi | G09G 3/3688 |
| | | | 345/690 |
| 2015/0348492 A1* | 12/2015 | Park | G09G 3/3666 |
| | | | 345/205 |
| 2016/0012794 A1* | 1/2016 | Takata | G09G 3/3685 |
| | | | 345/209 |
| 2017/0103725 A1* | 4/2017 | Seki | G09G 3/3696 |
| 2019/0122632 A1* | 4/2019 | Seki | G09G 3/3644 |
| 2020/0051478 A1* | 2/2020 | Wang | H03K 5/24 |

* cited by examiner

DISPLAY PANEL, METHOD FOR COMPENSATING FOR THE SAME, AND DISPLAY DEVICE

CROSS-REFERENCE TO RELATED APPLICATION

This application claims priority to Chinese Patent Application No. 201810892077.2, filed on Aug. 7, 2018, the content of which is incorporated by reference in the entirety.

FIELD

This disclosure relates to the field of display technologies, and particularly to a display panel, a method for compensating for the same, and a display device.

DESCRIPTION OF THE RELATED ART

As the display technologies are advancing constantly, a display panel with a large size has been increasingly favored, and as the display panel becomes larger, there is a demand for a higher drive capacity thereof, so it is necessary to splice a plurality of chips in the display panel to thereby drive the display panel.

SUMMARY

Embodiments of the disclosure provide a display panel, a method for compensating for the same, and a display device.

In an aspect, the embodiments of the disclosure provide a display panel, wherein the display panel includes driver chips including a primary driver chip and at least one slave driver chip, wherein each of the driver chips includes a gamma circuit; a processing circuit; and signal collectors on respective driver chips; wherein the signal collectors are configured to acquire current voltage at corresponding binding points of respective gamma circuits on the respective driver chips, and to provide the current voltage to the processing circuit; and the processing circuit is configured to compare current voltage at corresponding binding points of respective gamma circuits on respective slave driver chips with current voltage at a corresponding binding point of a gamma circuit on the primary driver chip, and to compensate for voltage to be output at the corresponding binding points of the respective gamma circuits on the respective slave driver chips according to comparison results so that the current voltage at the corresponding binding points of the respective gamma circuits on the respective driver chips are same.

In some embodiments, in the display panel above according to the embodiments of the disclosure, the processing circuit is on the primary driver chip.

In some embodiments, in the display panel above according to the embodiments of the disclosure, the processing circuit includes: a comparing element and a processing element, wherein: the comparing element is configured to compare the current voltage at the corresponding binding points of the respective gamma circuits on the respective slave driver chips with the current voltage at the corresponding binding point of the gamma circuit on the primary driver chip to determine differences in voltage between the corresponding binding points of the respective gamma circuits on the respective slave driver chips and the corresponding binding point of the gamma circuit on the primary driver chip, and to provide the differences in voltage to the processing element; and the processing element is configured to process the differences in voltage, and to add the processed differences in voltage to voltage at input terminals of the respective gamma circuits on the respective slave driver chip, so that the current voltage at the corresponding binding points of the respective gamma circuits on the respective slave driver chips is equal to the current voltage at the corresponding binding point of the gamma circuit on the primary driver chip.

In some embodiments, in the display panel above according to the embodiments of the disclosure, the comparing element includes a comparator, wherein: the comparator is connected respectively with respective signal collectors and the processing element, and configured to compare current voltage acquired by signal collectors in the respective slave driver chips respectively with current voltage acquired by a signal collector in the primary driver chip to determine differences in voltage between the current voltage at the corresponding binding points of the respective gamma circuits in the respective slave driver chips and the current voltage at the corresponding binding point of the gamma circuit in the primary driver chip, and to provide the differences in voltage to the processing element.

In some embodiments, in the display panel above according to the embodiments of the disclosure, each gamma circuit includes: a first register and a dividing element, wherein: the first register is configured to process a data signal input from outside, and to provide the processed data signal to the dividing element; and the dividing element is configured to receive and divide the processed data signal so that corresponding voltage is output at each binding point in the gamma circuit.

In some embodiments, in the display panel above according to the embodiments of the disclosure, each gamma circuit further includes a second register, wherein: an input terminal of the second register is connected with an output terminal of the first register, and an output terminal of the second register is connected with the dividing element; and all of input terminals of second registers on the respective slave driver chips are connected with an input terminal of a second register on the primary driver chip.

In some embodiments, in the display panel above according to the embodiments of the disclosure, each of the driver chips includes at least one signal collector; and the comparing element includes at least one comparator.

In some embodiments, in the display panel above according to the embodiments of the disclosure, the at least one signal collector corresponds to the at least one comparator in a one-to-one manner.

In some embodiments, in the display panel above according to the embodiments of the disclosure, the respective signal collectors are connected with the comparator via a bus.

In another aspect, the embodiments of the disclosure further provide a method for compensating for the display panel according to the embodiments of the disclosure, the method including: receiving, by the processing circuit, current voltage at corresponding binding points of the respective gamma circuits on the respective driver chips acquired and sent by the signal collectors; and comparing, by the processing circuit, current voltage at corresponding binding points of the respective gamma circuits on the respective slave driver chips with current voltage at a corresponding binding point of the gamma circuit on the primary driver chip, and compensating for voltage to be output at the corresponding binding points of the respective gamma circuits on the respective slave driver chips according to comparison results so that the current voltage at the corresponding binding points of the respective gamma circuits on the respective driver chips are same.

In some embodiments, in method above for compensating for the display panel according to the embodiments of the disclosure, comparing, by the processing circuit, the current voltage at the corresponding binding points of the respective gamma circuits on the respective slave driver chips with the current voltage at the corresponding binding point of the gamma circuit on the primary driver chip, and compensating for the voltage to be output at the corresponding binding points of the respective gamma circuits on the respective slave driver chips according to the comparison results so that the current voltage at the corresponding binding points of the respective gamma circuits on the respective driver chips are same, includes: comparing, by the processing circuit, the current voltage at the corresponding binding points of the respective gamma circuits on the respective slave driver chips with the current voltage at the corresponding binding point of the gamma circuit on the primary driver chip, to determine differences in voltage between the corresponding binding points of the respective gamma circuits on the respective slave driver chips and the corresponding binding point of the gamma circuit on the primary driver chip; and processing, by the processing circuit, the differences in voltage, and adding the processed differences in voltage to voltage at input terminals of the respective gamma circuits on the respective slave driver chip, so that the current voltage at the corresponding binding points of the respective gamma circuits on the respective slave driver chips is equal to the current voltage at the corresponding binding point of the gamma circuit on the primary driver chip.

In still another aspect, the embodiments of the disclosure further provide a display device, including a display panel, wherein the display panel includes: driver chips including a primary driver chip and at least one slave driver chip; wherein each of the driver chips includes a gamma circuit; a processing circuit; and signal collectors on respective driver chips; wherein the signal collectors are configured to acquire current voltage at corresponding binding points of respective gamma circuits on the respective driver chips, and to provide the current voltage to the processing circuit; and the processing circuit is configured to compare current voltage at corresponding binding points of respective gamma circuits on respective slave driver chips with current voltage at a corresponding binding point of a gamma circuit on the primary driver chip, and to compensate for voltage to be output at the corresponding binding points of the respective gamma circuits on the respective slave driver chips according to comparison results so that the current voltage at the corresponding binding points of the respective gamma circuits on the respective driver chips are same.

In some embodiments, in the display device above according to the embodiments of the disclosure, the processing circuit is on the primary driver chip.

In some embodiments, in the display device above according to the embodiments of the disclosure, the processing circuit includes: a comparing element and a processing element, wherein: the comparing element is configured to compare the current voltage at the corresponding binding points of the respective gamma circuits on the respective slave driver chips with the current voltage at the corresponding binding point of the gamma circuit on the primary driver chip to determine differences in voltage between the corresponding binding points of the respective gamma circuits on the respective slave driver chips and the corresponding binding point of the gamma circuit on the primary driver chip, and to provide the differences in voltage to the processing element; and the processing element is configured to process the differences in voltage, and to add the processed differences in voltage to voltage at input terminals of the respective gamma circuits on the respective slave driver chip, so that the current voltage at the corresponding binding points of the respective gamma circuits on the respective slave driver chips is equal to the current voltage at the corresponding binding point of the gamma circuit on the primary driver chip.

In some embodiments, in the display device above according to the embodiments of the disclosure, the comparing element includes a comparator, wherein: the comparator is connected respectively with respective signal collectors and the processing element, and configured to compare current voltage acquired by signal collectors in the respective slave driver chips respectively with current voltage acquired by a signal collector in the primary driver chip to determine differences in voltage between the current voltage at the corresponding binding points of the respective gamma circuits in the respective slave driver chips and the current voltage at the corresponding binding point of the gamma circuit in the primary driver chip, and to provide the differences in voltage to the processing element.

In some embodiments, in the display device above according to the embodiments of the disclosure, each gamma circuit includes: a first register and a dividing element, wherein: the first register is configured to process a data signal input from outside, and to provide the processed data signal to the dividing element; and the dividing element is configured to receive and divide the processed data signal so that corresponding voltage is output at each binding point in the gamma circuit.

In some embodiments, in the display device above according to the embodiments of the disclosure, each gamma circuit further includes a second register, wherein: an input terminal of the second register is connected with an output terminal of the first register, and an output terminal of the second register is connected with the dividing element; and all of input terminals of second registers on the respective slave driver chips are connected with an input terminal of a second register on the primary driver chip.

In some embodiments, in the display device above according to the embodiments of the disclosure, each of the driver chips includes at least one signal collector; and the comparing element includes at least one comparator.

In some embodiments, in the display device above according to the embodiments of the disclosure, the at least one signal collector corresponds to the at least one comparator in a one-to-one manner.

In some embodiments, in the display device above according to the embodiments of the disclosure, the respective signal collectors are connected with the comparator via a bus.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

Figure 1:
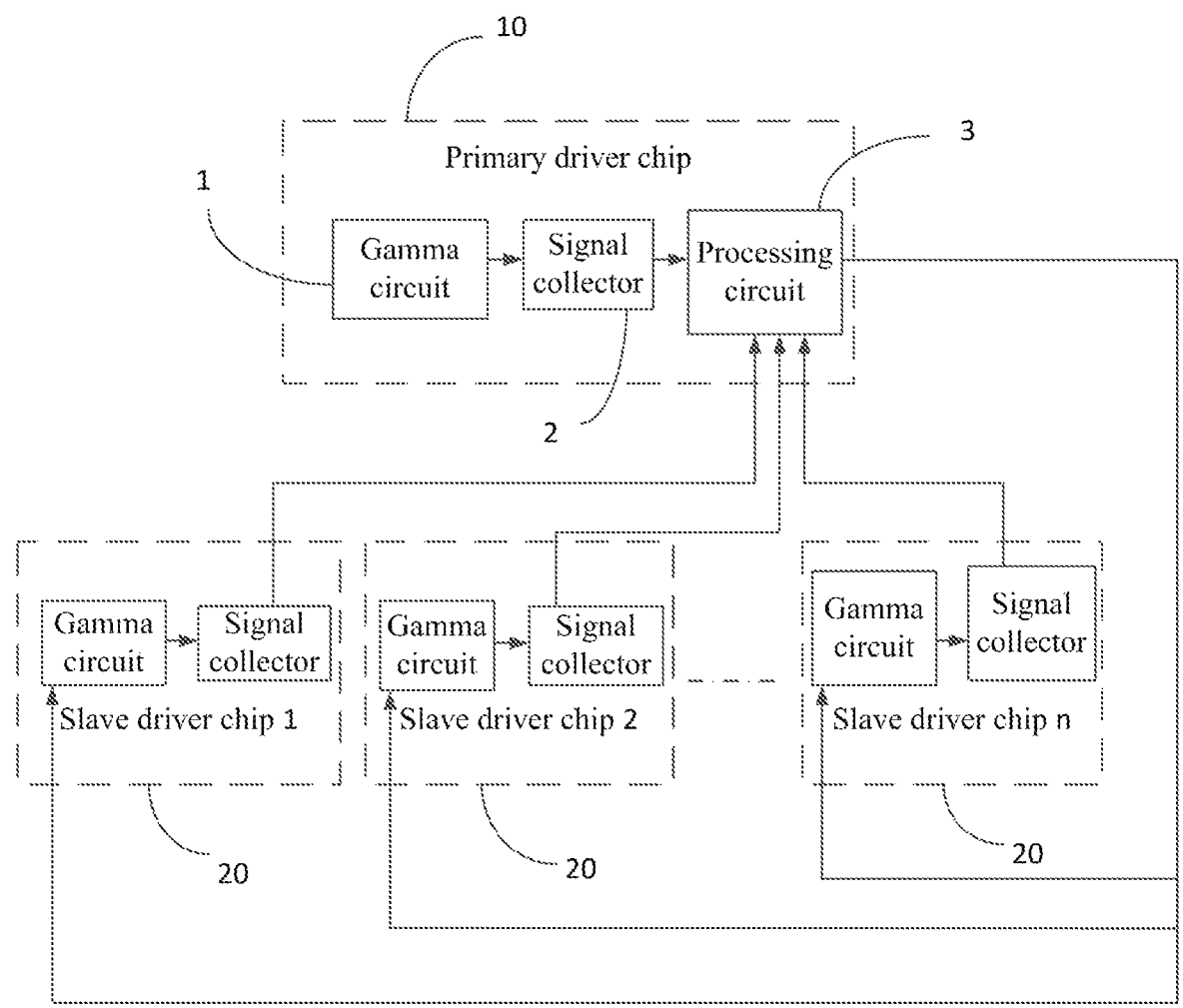
FIG. 1 is a schematic structural diagram of a display panel according to the embodiments of the disclosure.

In the related art, as a display panel becomes larger, there is a demand for a higher drive capacity thereof, so it is necessary to splice a plurality of chips in the display panel to thereby drive the display panel. However, in the case that different chips are spliced, gamma circuits are arranged on respective separate chips, and there are different internal structures of respective gamma circuits, so there may be a difference in voltage of approximately 15 mV at a same binding point of the respective gamma circuits, but there is such an insignificant difference in voltage between data signals in an organic light-emitting diode display panel that a difference between each grayscale and an adjacent grayscale lies within 15 mV, so there may be non-uniform brightness of the display panel due to the difference in voltage between the gamma circuits on different chip drivers.

Accordingly, it is highly desirable for those skilled in the art to address a difference in brightness of a display panel in which different chips are spliced.

In order to make the objects, technical solutions, and advantages of the disclosure more apparent, implementations of the display panel, the method for compensating for the same, and the display device according to the embodiments of the disclosure will be described below in details with reference to the drawings. It shall be appreciated that the embodiments to be described below are only intended to illustrate and explain the disclosure, but not intended to limit the disclosure thereto. The embodiments of the disclosure and the features in the embodiments can be combined with each other unless they conflict with each other.

Apparently the embodiments to be described are only a part but all of the embodiments of the disclosure. Based upon the embodiments here of the disclosure, all of other embodiments which can occur to those ordinarily skilled in the art without any inventive effort shall come into the scope of the disclosure as claimed. The shapes and sizes of respective components in the drawings are not intended to reflect any real proportion, but only intended to illustrate the content of the disclosure.

As illustrated in FIG. 1, the embodiments of the disclosure provide a display panel including a primary driver chip 10 and at least one slave driver chip 20, where each driver chip includes a gamma circuit 1; and the display panel further includes a processing circuit 3 (which can be located on the primary driver chip 10 as illustrated in FIG. 1, for example), and signal collectors 2 on respective driver chips.

Where the signal collectors 2 are configured to acquire current voltage at corresponding binding points of respective gamma circuits 1 on the respective driver chips, and to provide the current voltage to the processing circuit 3.

The processing circuit 3 is configured to compare current voltage at corresponding binding points of respective gamma circuits 1 on respective slave driver chips 20 with current voltage at a corresponding binding point of a gamma circuit 1 on the primary driver chip 10, and to compensate for voltage to be output at the corresponding binding points of the respective gamma circuits 1 on the respective slave driver chips 20 according to comparison results so that the current voltage at the corresponding binding points of the respective gamma circuits 1 on the respective driver chips are same.

In the embodiments of the disclosure, the display panel includes a primary driver chip, and a plurality of slave driver chips, each of which includes a gamma circuit, where the display panel further includes: a processing circuit, and a signal collector on each driver chip; the signal collectors are configured to acquire the current voltage at corresponding binding points of respective gamma circuits on the respective driver chips, and to provide the current voltage to the processing circuit; and the processing circuit is configured to compare the current voltage at corresponding binding points of respective gamma circuits on respective slave driver chips with the current voltage at a corresponding binding point of a gamma circuit on the primary driver chip, and to compensate for the voltage to be output at the corresponding binding points of the respective gamma circuits on the respective slave driver chips according to comparison results so that current voltage at the corresponding binding points of the respective gamma circuits on the respective driver chips are same. The signal collectors and the processing circuit cooperate with each other to compensate for the current voltage at the corresponding binding points of the respective gamma circuits on the respective slave driver chips so that there is the same current voltage at a corresponding binding point of a gamma circuit on each driver chip, thus resulting in uniform display brightness in respective areas of the display panel.

In some embodiments, the display panel according to the embodiments of the disclosure includes one primary driver chip and at least one slave driver chip (a slave driver chip 1, a slave driver chip 2, . . . , and a slave driver chip n, for example), i.e. the display panel includes at least two driver chips including one primary driver chip and one slave driver chip, where a gamma circuit is arranged on each driver chip, and there is such a difference in grayscale voltage at a same binding point of respective gamma circuits that there is a difference in display brightness in corresponding display areas driven by the respective gamma circuits. And by acquiring the current voltage at the corresponding binding points of the respective gamma circuits via respective signal collectors, and by comparing the voltage at the corresponding binding points of the slave driver chips with the voltage at the corresponding binding point of the primary driver chip, determining their differences in voltage, and compensating for the voltage at the corresponding binding points of the slave driver chips according to the differences in voltage, via the processing circuit, the voltage to be output at the corresponding binding point of the gamma circuit on the primary driver chip is the same as the voltage to be output at the corresponding binding points of the gamma circuits on the slave driver chips, thus guaranteeing the uniformity of display brightness in the display area driven by the primary driver chip, and the display areas driven by the slave driver chips.

It shall be noted that in the display panel above according to the embodiments of the disclosure, the processing circuit is generally located on the primary driver chip, and configured to compensate for the gamma circuit(s) on the slave driver chip(s). Of course, the processing circuit can alternatively be located on any one of the slave driver chip(s), although the embodiments of the disclosure will not be limited thereto.

It shall be noted that in the display panel above according to the embodiments of the disclosure, in order to determine whether there is the same voltage at corresponding binding points on different driver chips, typically the voltage at typical binding points in the gamma circuits is detected and compensated for, or of course, all the binding points in the respective gamma circuits can be detected, so there is a demand for a high processing capacity of the processing circuit; where specific binding points to be detected and compensated for can be selected as needed in reality, although the embodiments of the disclosure will not be limited thereto.

Figure 2:
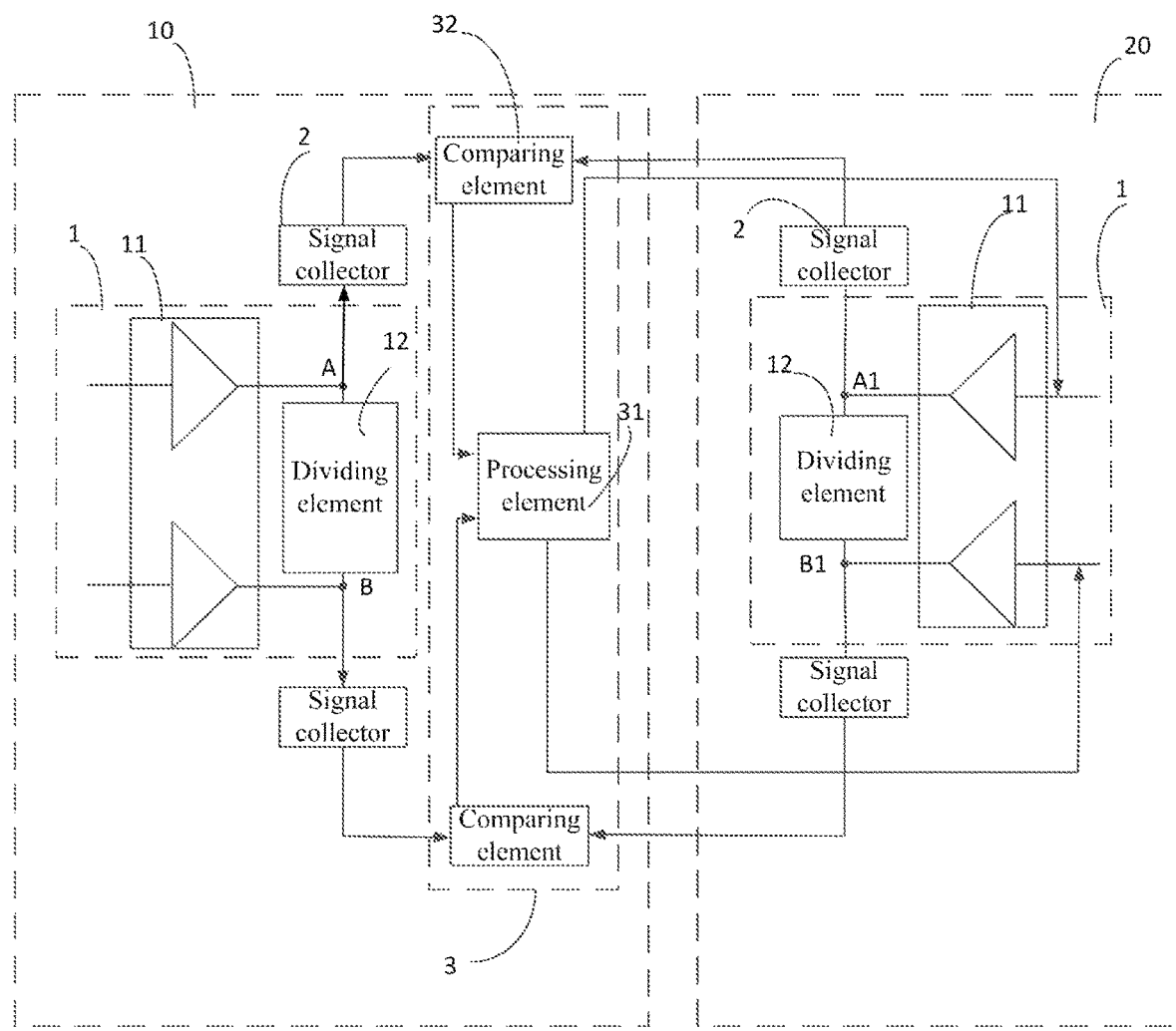
FIG. 2 is another schematic structural diagram of a display panel according to the embodiments of the disclosure.

In some embodiments, in the display panel above according to the embodiments of the disclosure, as illustrated in FIG. 2 (there are one primary driver chip 10 and one slave driver chip 20 as illustrated, for example), the processing circuit 3 includes: a comparing element 32 and a processing element 31.

Where, the comparing element 32 is configured to compare the current voltage at the corresponding binding points (A1 or B1, for example) of the respective gamma circuits 1 on the respective slave driver chips 20 with the current voltage at the corresponding binding point (A or B, for example) of the gamma circuit 1 on the primary driver chip 10 to determine differences in voltage between the corresponding binding points (A1 or B1, for example) of the respective gamma circuits 1 on the respective slave driver chips 20, and the corresponding binding point (A or B, for example) of the gamma circuit 1 on the primary driver chip 10, and to provide the differences in voltage to the processing element 31.

The processing element 31 is configured to process the differences in voltage, and to add the processed differences in voltage to voltage at input terminals of the respective gamma circuits 1 on the respective slave driver chip 20, so that the current voltage at the corresponding binding points (A1 or B1, for example) of the respective gamma circuits 1 on the respective slave driver chips 20 is equal to the current voltage at the corresponding binding point (A or B, for example) of the gamma circuit 1 on the primary driver chip 10.

It shall be noted that in the display panel above according to the embodiments of the disclosure, as illustrated in FIG. 2, the binding point A on the primary driver chip and the binding point A1 on the slave driver chip are corresponding binding points, and the binding point B on the primary driver chip and the binding point B1 on the slave driver chip are corresponding binding points, where A (A1) and B (B1) are only two typical binding points in a gamma circuit, but there are more binding points corresponding to respective grayscale voltage after division by a dividing element, and the respective binding points can be compensated for under the same principle, so a repeated description thereof will be omitted here.

In some embodiments, in the display panel above according to the embodiments of the disclosure, the respective signal collectors provide the acquired voltage at the corresponding binding points to the comparing element, the comparing element compares the voltage at the corresponding binding points of the respective gamma circuits on the respective slave driver chips with the voltage at the corresponding binding point on the primary driver chip, determines the differences in voltage between the voltage at the corresponding binding points of the respective slave driver chips, and the voltage at the corresponding binding point of the primary driver chip, and provides the differences in voltage to the processing element, and the processing element compensates for the voltage to be output at the corresponding binding points of the respective slave driver chips according to the differences in voltage so that there is the same voltage at the corresponding binding point of each driver chip. For example, voltage at a binding point at a first grayscale in the gamma circuit on the primary driver chip is V1, and voltage at a binding point at the first grayscale in a gamma circuit on a slave driver chip is V2, where $\Delta V=V1-V2$; and the processing element determines a compensation value as a function of $\Delta V$, and adds the compensation value to the voltage at an input terminal of the gamma circuit on the slave driver chip, so that there is the same voltage at the corresponding binding point on each driver chip.

In some embodiments, in the display panel above according to the embodiments of the disclosure, the comparing element includes a comparator, where the comparator is connected respectively with respective signal collectors and the processing element, and configured to compare current voltage acquired by signal collectors in the respective slave driver chips respectively with current voltage acquired by a signal collector in the primary driver chip to determine differences in voltage between the current voltage at the corresponding binding points of the respective gamma circuits in the respective slave driver chips and the current voltage at the corresponding binding point of the gamma circuit in the primary driver chip, and to provide the differences in voltage to the processing element.

In some embodiments, in the display panel above according to the embodiments of the disclosure, as illustrated in FIG. 2, each gamma circuit 1 includes a first register 11 and a dividing element 12, where: the first register 11 is configured to process a data signal input from outside, and to provide the processed data signal to the dividing element 12; and the dividing element 12 is configured to receive and divide the processed data signal so that corresponding voltage is output at each binding point in the gamma circuit 1.

In some embodiments, in the display panel above according to the embodiments of the disclosure, the first register includes a plurality of amplifiers configured to amplify the input data signal, and to provide the amplified data signal to the dividing element of the gamma circuit, and after that the voltage at the corresponding binding point is output as a result of division by the dividing element, where the dividing element can be a resistor string.

Figure 3:
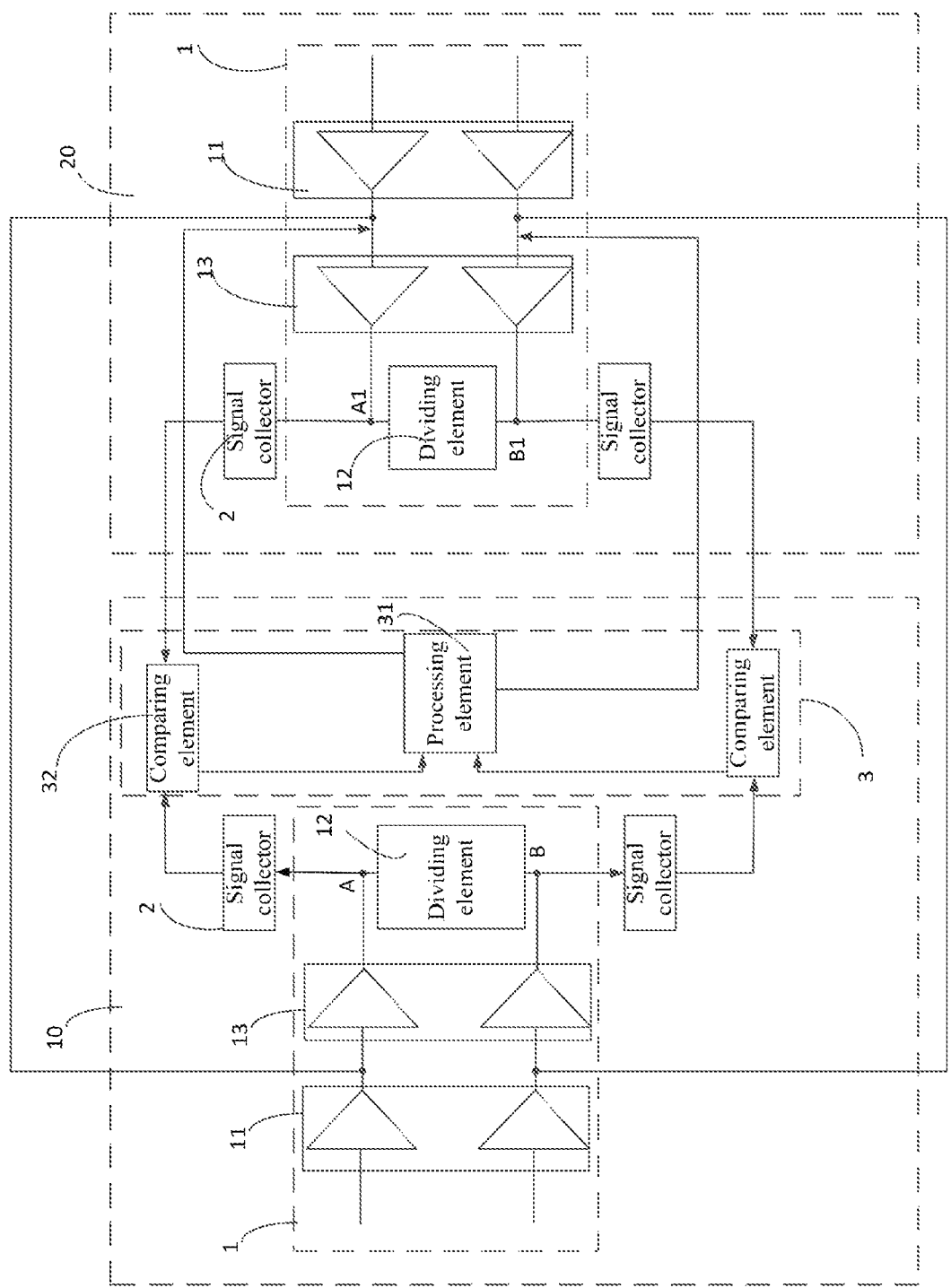
FIG. 3 is still another schematic structural diagram of a display panel according to the embodiments of the disclosure.

In some embodiments, in the display panel above according to the embodiments of the disclosure, as illustrated in FIG. 3, each gamma circuit further includes a second register 13, where an input terminal of the second register 13 is connected with an output terminal of the first register 11, and an output terminal of the second register 13 is connected with the dividing element 12, where all of input terminals of second registers 13 on the respective slave driver chips 20 are connected with an input terminal of a second register 13 on the primary driver chip 10.

In some embodiments, in the display panel above according to the embodiments of the disclosure, the input terminals of the second registers are connected with the output terminals of the first registers, the output terminals of the second registers are connected with the dividing elements, and the input terminals of the second registers on the respective slave driver chips are connected (i.e., shorted) with the input terminal of the second register on the primary driver chip, so that the voltage at the input terminals of the second registers on the slave driver chips is equal to the voltage at the input terminal of the second register on the primary driver chip, but the voltage at the input terminals of the second registers on the slave driver chips may still be slightly different from the voltage at the input terminal of the second register on the primary driver chip due to a resistance of a connection line while they are shorted with each other, so the respective signal collectors acquire the voltage at the output terminals of the second registers on the respective driver chips, and the processing circuit processes the acquired voltage (under the same principle to that in the embodiments above, although a repeated description thereof will be omitted here), and compensates for the slight differences in voltage at the input terminals of the respective second registers so that there is the same voltage at the corresponding binding points on the respective driver chips. In this circuit structure, there will be lower voltage to be compensated for by the processing circuit, thus making it easier to compensate for the voltage at the corresponding binding points in the respective gamma circuits on the respective slave driver chips more finely.

It shall be noted that in the display panel above according to the embodiments of the disclosure, the signal collectors can acquire the voltage at the corresponding binding points of the respective gamma circuits as described in the embodiments above, or can acquire light emitted from pixels corresponding to the respective binding points, and the processing circuit can compensate for the terminals corresponding to the respective gamma circuits after processing those acquired voltage or light signals, as needed in reality, although the embodiments of the disclosure will not be limited thereto.

In some embodiments, in the display panel above according to the embodiments of the disclosure, each driver chip includes at least one signal collector, and the comparing element includes at least one comparator.

For example, in the display panel above according to the embodiments of the disclosure, each driver chip can include a plurality of signal collectors, and each signal collector can acquire voltage at only one binding point, or voltage at a plurality of binding points, and then provide the acquired voltage to a corresponding comparator for processing; where the at least one signal collector can correspond to the at least one comparator in a one-to-one manner, or each signal collector can correspond to more than one comparator, although the embodiments of the disclosure will not be limited thereto.

In some embodiments, in the display panel above according to the embodiments of the disclosure, the respective signal collectors are connected with the respective comparators via a bus.

In some embodiments, in the display panel above according to the embodiments of the disclosure, the respective signal collectors can alternatively be connected with the respective comparators via serial interfaces, or of course, can be connected otherwise herewith, although the embodiments of the disclosure will not be limited thereto.

Figure 4:
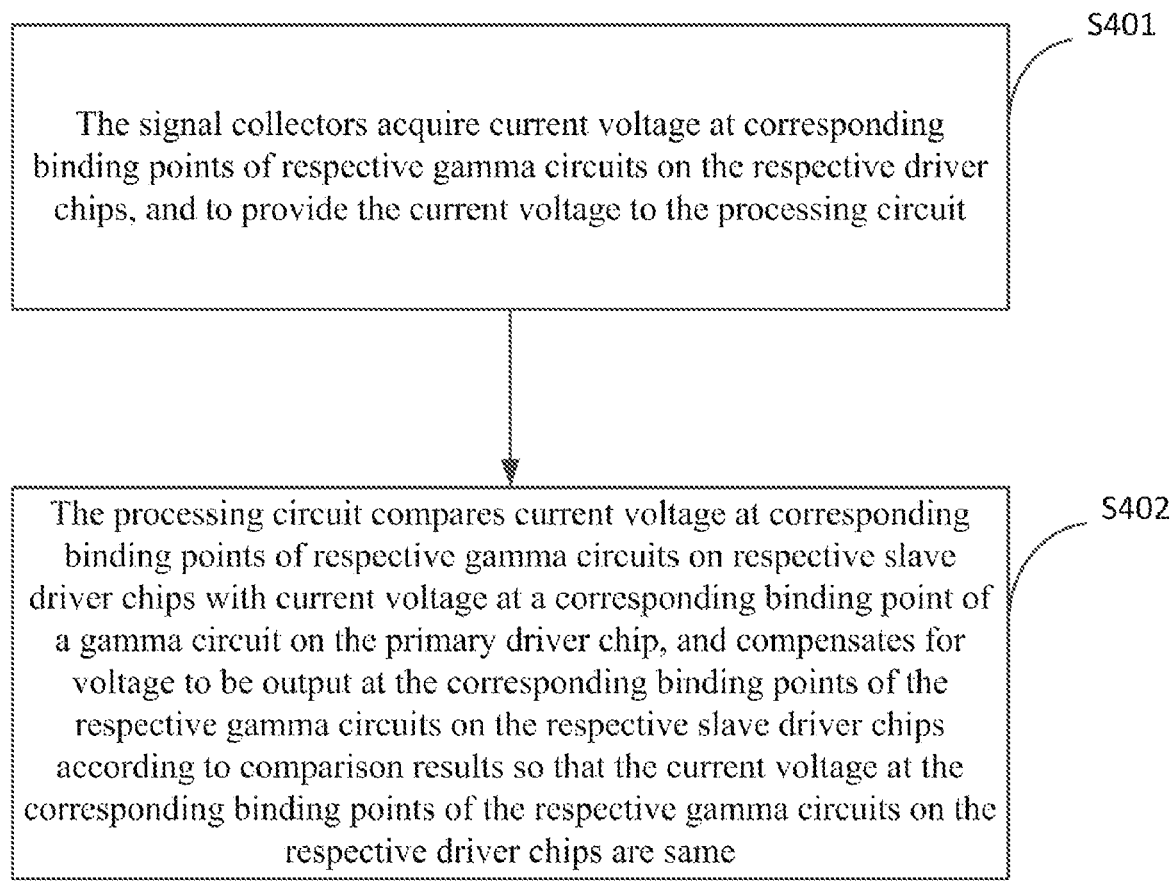
FIG. 4 is a flow chart of a method for compensating for a display panel according to the embodiments of the disclosure.

Based upon the same inventive concept, as illustrated in FIG. 4, the embodiments of the disclosure further provide a method for compensating for the display panel above according to the embodiments of the disclosure, where the method includes following operations.

In the operation S401, the signal collectors acquire current voltage at corresponding binding points of respective gamma circuits on the respective driver chips, and to provide the current voltage to the processing circuit.

In the operation S402, the processing circuit compares current voltage at corresponding binding points of respective gamma circuits on respective slave driver chips with current voltage at a corresponding binding point of a gamma circuit on the primary driver chip, and compensates for voltage to be output at the corresponding binding points of the respective gamma circuits on the respective slave driver chips according to comparison results so that the current voltage at the corresponding binding points of the respective gamma circuits on the respective driver chips are same.

In some embodiments, in the method above for compensating for the display panel above according to the embodiments of the disclosure, the operation S401 includes following operations.

The comparing element compares the current voltage at the corresponding binding points of the respective gamma circuits on the respective slave driver chips with the current voltage at the corresponding binding point of the gamma circuit on the primary driver chip to determine differences in voltage between the corresponding binding points of the respective gamma circuits on the respective slave driver chips and the corresponding binding point of the gamma circuit on the primary driver chip, and provides the differences in voltage to the processing element; and the processing element processes the differences in voltage, and adds the processed differences in voltage to voltage at input terminals of the respective gamma circuits on the respective slave driver chip, so that the current voltage at the corresponding binding points of the respective gamma circuits on the respective slave driver chips is equal to the current voltage at the corresponding binding point of the gamma circuit on the primary driver chip.

The principle of the method above for compensating the display panel according to the embodiments of the disclosure is the same as the principle in the display panel above according to the embodiments of the disclosure, so reference can be made to the operating principle of the display panel above for the principle of the method for compensating for the display panel, and a repeated description thereof will be omitted here.

Based upon the same inventive concept, the embodiments of the disclosure further provide a display device including the display panel above according to the embodiments of the disclosure. Where, the display device can be a mobile phone, a tablet computer, a TV set, a monitor, a notebook computer, a digital photo frame, a navigator, or any other product or component with a display function. Reference can be made to the embodiments of the display panel above for an implementation of the display device, so a repeated description thereof will be omitted here.

In the display panel, the method for compensating for the same, and the display device according to the embodiments of the disclosure, the display panel includes a primary driver chip, and a plurality of slave driver chips, each of which includes a gamma circuit, where the display panel further includes: a processing circuit, and a signal collector on each driver chip; the signal collectors are configured to acquire the current voltage at corresponding binding points of respective gamma circuits on the respective driver chips, and to provide the current voltage to the processing circuit; and the processing circuit is configured to compare the current voltage at corresponding binding points of respective gamma circuits on respective slave driver chips with the current voltage at a corresponding binding point of a gamma circuit on the primary driver chip, and to compensate for the voltage to be output at the corresponding binding points of the respective gamma circuits on the respective slave driver chips according to comparison results so that current voltage at the corresponding binding points of the respective gamma circuits on the respective driver chips are same. The signal collectors and the processing circuit cooperate with each other to compensate for the current voltage at the corresponding binding points of the respective gamma circuits on the respective slave driver chips so that there is the same current voltage at a corresponding binding point of a gamma circuit on each driver chip, thus resulting in uniform display brightness in respective areas of the display panel.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display panel, comprising:
    a processor; and
    a memory for storing an instruction capable of being executed by the processor;
    driver chips comprising a primary driver chip and at least one slave driver chip, wherein each of the driver chips comprises a gamma circuit;
    a processing circuit; and
    signal collectors on respective driver chips;
    wherein the processor is configured to execute the instruction to control the signal collectors to: acquire current voltage at corresponding binding points of respective gamma circuits on the respective driver chips, and to provide the current voltage to the processing circuit; and
    the processor is further configured to execute the instruction to control the processing circuit to: compare current voltage at corresponding binding points of respective gamma circuits on respective slave driver chips with current voltage at a corresponding binding point of a gamma circuit on the primary driver chip, and to compensate for voltage to be output at the corresponding binding points of the respective gamma circuits on the respective slave driver chips according to comparison results so that the current voltage at the corresponding binding points of the respective gamma circuits on the respective driver chips are same;
    wherein each gamma circuit comprises: a first register and a dividing element, wherein:
    the processor is further configured to execute the instruction to control the first register to process a data signal input from outside, and to provide the processed data signal to the dividing element; and
    the processor is further configured to execute the instruction to control the dividing element receive and divide the processed data signal so that corresponding voltage is output at each binding point in the gamma circuit; wherein:
    an input terminal of the second register is connected with an output terminal of the first register, and an output terminal of the second register is connected with the dividing element; and
    all of input terminals of second registers on the respective slave driver chips are connected with an input terminal of a second register on the primary driver chip.

2. The display panel according to claim 1, wherein the processing circuit is on the primary driver chip.

3. The display panel according to claim 1, wherein the processing circuit comprises: a comparing element and a processing element, wherein:

the processor is further configured to execute the instruction to control the comparing element to compare the current voltage at the corresponding binding points of the respective gamma circuits on the respective slave driver chips with the current voltage at the corresponding binding point of the gamma circuit on the primary driver chip to determine differences in voltage between the corresponding binding points of the respective gamma circuits on the respective slave driver chips and the corresponding binding point of the gamma circuit on the primary driver chip, and to provide the differences in voltage to the processing element; and the processor is further configured to execute the instruction to control the processing element to process the differences in voltage, and to add the processed differences in voltage to voltage at input terminals of the respective gamma circuits on the respective slave driver chip, so that the current voltage at the corresponding binding points of the respective gamma circuits on the respective slave driver chips is equal to the current voltage at the corresponding binding point of the gamma circuit on the primary driver chip.

4. The display panel according to claim 3, wherein:
the comparing element comprises a comparator, and
the comparator is connected respectively with respective signal collectors and the processing element;
wherein the processor is further configured to execute the instruction to control the comparator to compare current voltage acquired by signal collectors in the respective slave driver chips respectively with current voltage acquired by a signal collector in the primary driver chip to determine differences in voltage between the current voltage at the corresponding binding points of the respective gamma circuits in the respective slave driver chips and the current voltage at the corresponding binding point of the gamma circuit in the primary driver chip, and to provide the differences in voltage to the processing element.

5. The display panel according to claim 4, wherein each of the driver chips comprises at least one signal collector; and the comparing element comprises at least one comparator.

6. The display panel according to claim 5, wherein the at least one signal collector corresponds to the at least one comparator in a one-to-one manner.

7. The display panel according to claim 4, wherein the respective signal collectors are connected with the comparator via a bus.

8. A display device, comprising a display panel, wherein the display panel comprises:
    a processor; and
    a memory for storing an instruction capable of being executed by the processor;
    driver chips comprising a primary driver chip and at least one slave driver chip; wherein each of the driver chips comprises a gamma circuit;
    a processing circuit; and
    signal collectors on respective driver chips;
    wherein the processor is configured to execute the instruction to control the signal collectors to acquire current voltage at corresponding binding points of respective gamma circuits on the respective driver chips, and to provide the current voltage to the processing circuit; and
    the processor is configured to execute the instruction to control the processing circuit to compare current voltage at corresponding binding points of respective gamma circuits on respective slave driver chips with current voltage at a corresponding binding point of a gamma circuit on the primary driver chip, and to compensate for voltage to be output at the corresponding binding points of the respective gamma circuits on the respective slave driver chips according to comparison results so that the current voltage at the corresponding binding points of the respective gamma circuits on the respective driver chips are same;

wherein each gamma circuit comprises: a first register and a dividing element, wherein:

the processor is further configured to execute the instruction to control the first register to process a data signal input from outside, and to provide the processed data signal to the dividing element; and the processor is further configured to execute the instruction to control the dividing element receive and divide the processed data signal so that corresponding voltage is output at each binding point in the gamma circuit;

wherein:

an input terminal of the second register is connected with an output terminal of the first register, and an output terminal of the second register is connected with the dividing element; and all of input terminals of second registers on the respective slave driver chips are connected with an input terminal of a second register on the primary driver chip.

9. The display device according to claim 8, wherein the processing circuit is on the primary driver chip.

10. The display device according to claim 8, wherein the processing circuit comprises: a comparing element and a processing element, wherein:

the processor is further configured to execute the instruction to control the comparing element compare the current voltage at the corresponding binding points of the respective gamma circuits on the respective slave driver chips with the current voltage at the corresponding binding point of the gamma circuit on the primary driver chip to determine differences in voltage between the corresponding binding points of the respective gamma circuits on the respective slave driver chips and the corresponding binding point of the gamma circuit on the primary driver chip, and to provide the differences in voltage to the processing element; and the processor is further configured to execute the instruction to control the processing element to process the differences in voltage, and to add the processed differences in voltage to voltage at input terminals of the respective gamma circuits on the respective slave driver chip, so that the current voltage at the corresponding binding points of the respective gamma circuits on the respective slave driver chips is equal to the current voltage at the corresponding binding point of the gamma circuit on the primary driver chip.

11. The display device according to claim 10, wherein:

the comparing element comprises a comparator, and the comparator is connected respectively with respective signal collectors and the processing element;

wherein the processor is further configured to execute the instruction to compare current voltage acquired by signal collectors in the respective slave driver chips respectively with current voltage acquired by a signal collector in the primary driver chip to determine differences in voltage between the current voltage at the corresponding binding points of the respective gamma circuits in the respective slave driver chips and the current voltage at the corresponding binding point of the gamma circuit in the primary driver chip, and to provide the differences in voltage to the processing element.

12. The display device according to claim 11, wherein each of the driver chips comprises at least one signal collector; and the comparing element comprises at least one comparator.

13. The display device according to claim 12, wherein the at least one signal collector corresponds to the at least one comparator in a one-to-one manner.

14. The display device according to claim 11, wherein the respective signal collectors are connected with the comparator via a bus.

* * * * *